United States Patent
Hou et al.

(10) Patent No.: US 9,978,941 B2
(45) Date of Patent: May 22, 2018

(54) SELF-RECTIFYING RESISTIVE RANDOM ACCESS MEMORY CELL STRUCTURE

(71) Applicant: WINBOND ELECTRONICS CORP., Taichung (TW)

(72) Inventors: Tuo-Hung Hou, Hsinchu (TW); Chung-Wei Hsu, Taitung (TW); Chun-Tse Chou, New Taipei (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days. days.

(21) Appl. No.: 14/854,898

(22) Filed: Sep. 15, 2015

(65) Prior Publication Data

US 2016/0093802 A1    Mar. 31, 2016

(30) Foreign Application Priority Data

Sep. 26, 2014   (TW) .............................. 103133447 A

(51) Int. Cl.
*H01L 45/00* (2006.01)

(52) U.S. Cl.
CPC ............ *H01L 45/146* (2013.01); *H01L 45/04* (2013.01); *H01L 45/08* (2013.01); *H01L 45/1233* (2013.01)

(58) Field of Classification Search
CPC ...................................................... H01L 47/00
USPC ..................................................... 257/3, 4, 5
See application file for complete search history.

(56) References Cited

U.S. PATENT DOCUMENTS

| 7,978,047 | B2 | 7/2011 | Hosoi et al. |
| 7,985,963 | B2 | 7/2011 | Rinerson et al. |
| 2009/0272959 | A1 | 11/2009 | Phatak et al. |
| 2009/0273087 | A1* | 11/2009 | French ................ C23C 14/0042 257/761 |
| 2013/0301341 | A1 | 11/2013 | Jo |
| 2014/0034898 | A1 | 2/2014 | Lu et al. |
| 2014/0117298 | A1* | 5/2014 | Chen ....................... H01L 45/08 257/2 |
| 2014/0158967 | A1 | 6/2014 | Hou et al. |
| 2015/0131361 | A1* | 5/2015 | Chu ...................... G11C 29/027 365/148 |

FOREIGN PATENT DOCUMENTS

| CN | 103400936 A | 11/2013 |
| CN | 103682096 A | 6/2014 |
| CN | 103872245 A | 6/2014 |

* cited by examiner

*Primary Examiner* — Marvin Payen
(74) *Attorney, Agent, or Firm* — Muncy, Geissler, Olds & Lowe, P.C.

(57) ABSTRACT

A self-rectifying resistive random access memory (RRAM) cell structure is provided. The self-rectifying RRAM cell structure includes a first electrode. An insulator-metal-transition (IMT) material layer is disposed on the first electrode. A barrier layer is disposed on the IMT material layer. A second electrode is disposed on the barrier layer. The IMT material layer is separated from the second electrode by the barrier layer.

9 Claims, 5 Drawing Sheets

SELF-RECTIFYING RESISTIVE RANDOM ACCESS MEMORY CELL STRUCTURE

CROSS REFERENCE TO RELATED APPLICATIONS

This application claims the benefit of Taiwan Patent Application No. 103133447 filed on Sep. 26, 2014, entitled "SELF-RECTIFYING RESISTIVE RANDOM ACCESS MEMORY CELL STRUCTURE" which is hereby incorporated herein by reference.

BACKGROUND

Field of the Disclosure

The present disclosure relates to a memory device, and in particular, it relates to a resistive random access memory (RRAM).

Description of the Related Art

Designers are now looking at next-generation nonvolatile memories such as magnetoresistive random access memories (MRAMs), phase change random access Memories (PCRAMs), conductive bridging random access memories (CBRAMs) and resistive random access memories (RRAMs), to increase writing speeds and decrease power consumption. Among the non-volatile memories, the RRAM has become a mainstream option for emerging non-volatile memories due to its simple structure, simple crossbar array, suitability for low-temperature fabrication, low power consumption, low operating voltage, short writing/erasing times, long endurance, long retention times, non-destructive read, multi-state memory, simple device fabrication and capability of microminiaturizing. A conventional resistive non-volatile memory cell structure is composed of a bottom electrode, a resistive switching layer, and a top electrode to constitute a stack of metal-insulator-metal (MIM). Moreover, the resistive switching (RS) property of resistive non-volatile memory is important for devices.

Although the RRAM crossbar array architecture is simple, there are still many problems that need to be overcome for fabrication, especially for three-dimensional (3D) crossbar array architectures. Without a vertical 3D architecture, the RRAM will most likely not be able to compete with 3D NAND memories in terms of bit cost for mass data storage.

The RRAM crossbar array architectures based on resistive switching elements theoretically allows for the smallest cell size of $4F^2$ where F is the minimum feature size, and the low-temperature fabrication enables stacking of memory arrays three-dimensionally, for unprecedented high-integration density. However, in the 1R structure (having a resistive element only), undesired sneak current that flows through neighboring unselected memory cells significantly deteriorates the read margin, and limits the maximum size of the crossbar array to below 64 bits. This problem can be mitigated by additional non-linear selection devices in series with the resistive switching elements. Some memory cell structures, such as one diode-one resistor (1D1R), one bipolar selector-one resistor (1S1R), one MOSFET transistor-one resistor (1T1R), and one bipolar junction transistor-one resistor 1BJT1R memory cell structures, have been developed. Among the memory cell structures, the 1T1R and 1BJT1R memory cell structures are undesirable because of the complicated and high-temperature fabrication requirements of MOSFETs and BJTs, while the complementary resistive switching (CRS) memory cell structure suffers from the issue of destructive read. Hence, the 1D1R and 1S1R memory cell structures appear to be the leading contenders for the 3D crossbar array architectures.

SUMMARY

In some embodiments of the disclosure, a self-rectifying RRAM cell structure is provided. The self-rectifying RRAM cell structure includes a first electrode. An insulator-metal-transition (IMT) material layer is disposed on the first electrode. A barrier layer is disposed on the IMT material layer. A second electrode is disposed on the barrier layer. The IMT material layer is separated from the second electrode by the barrier layer.

A detailed description is given in the following embodiments with reference to the accompanying drawings.

BRIEF DESCRIPTION OF THE DRAWINGS

The present disclosure can be further understood by reading the subsequent detailed description and examples with references made to the accompanying drawings, wherein.

DETAILED DESCRIPTION

Figure 1:
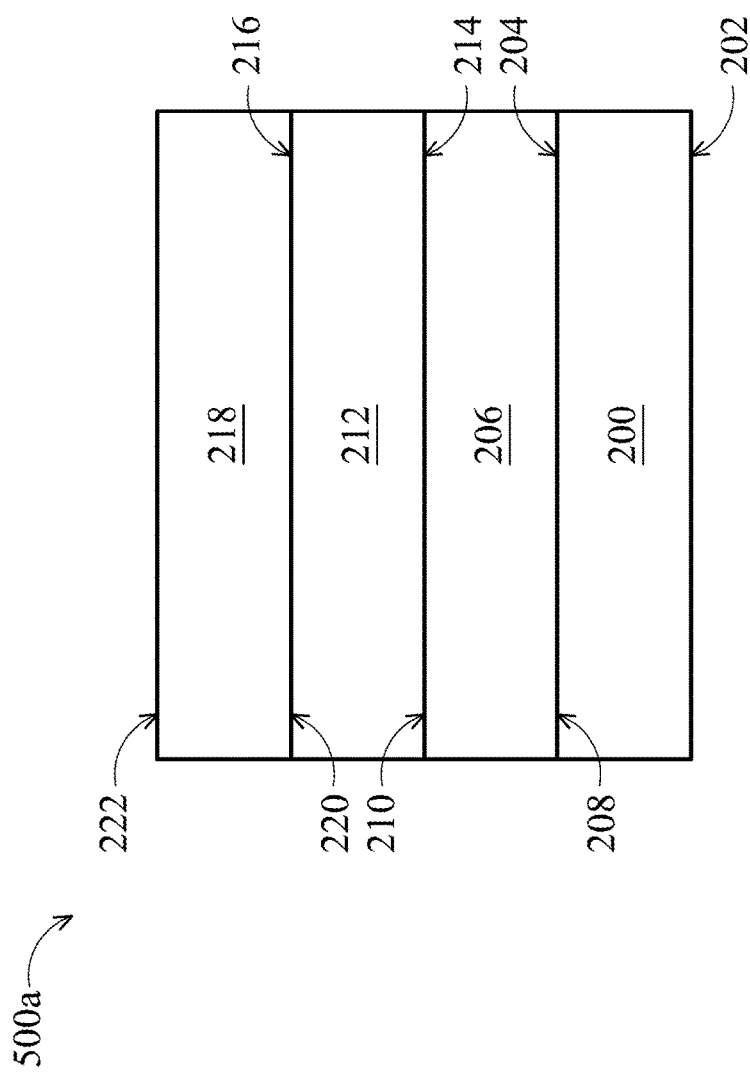
FIG. 1 shows a cross section of a RRAM cell structure according to an embodiment of the disclosure.

The following description is of the best-contemplated mode of carrying out the disclosure. This description is made for the purpose of illustrating the general principles of the disclosure and should not be taken in a limiting sense. These are, of course, merely examples and are not intended to be limited. In addition, the disclosure may repeat reference numerals and/or letters in the various examples. This repetition is for the purpose of simplicity and clarity and does not in itself dictate a relationship between the various embodiments and/or configurations discussed.

The disclosure provides a RRAM cell structure, such as a resistive non-volatile memory cell structure with self-compliance and self-rectifying characteristics. Such a RRAM cell structure has a resistive transition layer that is formed of an insulator-metal-transition material, and therefore this layer can be referred to as an IMT material layer. Moreover, the IMT material layer is separated from an electrode coupled to an operating bias (e.g., a non-zero positive or negative voltage) by a barrier layer. The RRAM cell structure has a stack structure of metal-insulator-insulator-metal, and therefore it has self-compliance and self-rectifying characteristics, and also can overcome the problem of sneak current occurring in the 1R memory cell structures of the conventional RRAM 3D crossbar array architectures.

FIG. 1 shows a cross section of a resistive random access memory cell structure 500a according to an embodiment of the disclosure. In the embodiment, the RRAM cell structure 500a includes a first electrode 200, an insulator-metal-transition material layer 206, a barrier layer 212 and a second electrode 218. As shown in FIG. 1, the RRAM cell structure 500a has a horizontal stack of MIIM structure.

Namely, the interface of two adjacent layers in the RRAM cell structure 500a is substantially parallel to a surface of a substrate (not shown).

The first electrode 200 has a bottom surface 202 and a top surface 204, and the second electrode 218 has a bottom surface 220 and a top surface 222. As shown in FIG. 1, the second electrode 218 is disposed over the top surface 204 of the first electrode 200. The first electrode 200 may act as a bottom electrode, and the second electrode 218 may act as a top electrode. In some embodiments, the first electrode 200 and the second electrode 218 may be formed of a material selected from a group consisting of Ti, Ta, Ni, Cu, W, Hf, Zr, Nb, Y, Zn, Co, Al, Si, Ge and their alloys. For example, the first electrode 200 may be formed of Ti, and the second electrode 218 may be formed of Ta. The first electrode 200 and the second electrode 218 may be formed by electron beam evaporation (EBE) or sputtering.

As shown in FIG. 1, the IMT material layer 206 is disposed on the top surface 204 of the first electrode 200. In some embodiments, the IMT material layer 206 has a bottom surface 208 and a top surface 210. The bottom surface 208 of the IMT material layer 206 may directly contact the top surface 204 of the first electrode 200. Moreover, the IMT material layer 206 may form an ohmic contact with the first electrode 200. In some embodiments, the IMT material layer 206 may have two different resistance states (e.g., the insulating state and the metallic state) by applying different voltages thereto. Accordingly, the IMT material layer 206 may serve as a resistive transition layer of the RRAM cell structure for data storage. Moreover, the IMT material layer 206 has no conductive filament when different voltages are applied thereto. The IMT material layer 206 may be formed of a material that includes $NiO_x$, $TiO_x$, $VO_x$, $FeO_x$, $CoO_x$, $NbO_x$, praseodymium calcium manganese oxide (PCMO) or a combination thereof. In some embodiments, the IMT material layer 206 may be formed by deposition, such as atomic layer deposition (ALD), chemical vapor deposition (CVD), plasma enhanced chemical vapor deposition (PECVD), metal-organic chemical vapor deposition (MOCVD), physical vapor deposition (PVD) or other suitable deposition methods. Alternatively, in some embodiments, the IMT material layer 206 may be formed by directly oxidizing the surface of the first electrode 200. For example, the surface of the first electrode 200 is directly oxidized by thermal oxidation or laser oxidation, to form the IMT material layer 206.

As shown in FIG. 1, the barrier layer 212 is disposed on the top surface 210 of the IMT material layer 206. The barrier layer 212 has a bottom surface 214 and a top surface 216. The bottom surface 214 of the barrier layer 212 may directly contact the top surface 210 of the IMT material layer 206, and the top surface 216 of the barrier layer 212 may directly contact the bottom surface 220 of the second electrode 218. Therefore, the barrier layer 212 is separated from the first electrode 200 by the IMT material layer 216. In some embodiments, the barrier layer 212 may be formed of an insulator having a bandgap of about more than 2 eV. Moreover, the material of the barrier layer 212 may be selected, such that its bandgap is higher than that of the first electrode 200, the IMT material layer 206, and the second electrode 218. Accordingly, when electrons are injected into the IMT material layer 206 from the first electrode 200 by applying a voltage to the RRAM cell structure 500a, such that the state of the IMT material layer 206 is transformed in a low resistance state (i.e., metallic state), the electrons are blocked by the barrier layer 212. Therefore, the electrons are not injected into the second electrode 218 and thus the resistance state of the IMT material layer 206 is not switched again. Alternatively, when electrons in the IMT material layer 206 escape to the first electrode 200 by applying a voltage to the RRAM cell structure 500a, such that the state of the IMT material layer 206 is transformed in a high resistance state (i.e., insulating state), the electrons injecting toward the IMT material layer 206 from the second electrode 218 are blocked by the barrier layer 212. Therefore, the electrons are not injected into the IMT material layer 206 and thus the resistance state of the IMT material layer 206 is not switched again. Moreover, when a voltage is applied to operate the RRAM cell structure 500a, the barrier layer 212 disposed between the second electrode 218 and the IMT material layer 206 makes the RRAM cell structure 500a have a non-linear relationship of current-versus-voltage (I-V). The barrier layer 212 may be formed of a material including $TaO_x$, $HfO_2$, $SiO_2$ or a combination thereof.

In some embodiments, the barrier layer 212 is formed of $SiO_2$. Moreover, the barrier layer 212 and the IMT material layer 206 are formed of different materials. In some embodiments, the IMT material layer 206 is formed of an oxide of the metal element of the first electrode 200, and the barrier layer 212 is formed of an oxide of the metal element of the second electrode 218. The metal element of the first electrode 200 is different from that of the second electrode 218. For example, the IMT material layer 206 is formed of $TiO_2$ while the first electrode 200 is formed of Ti, and the barrier layer 212 is formed of $Ta_2O_x$ while the second electrode 218 is formed of Ta.

Figure 2:
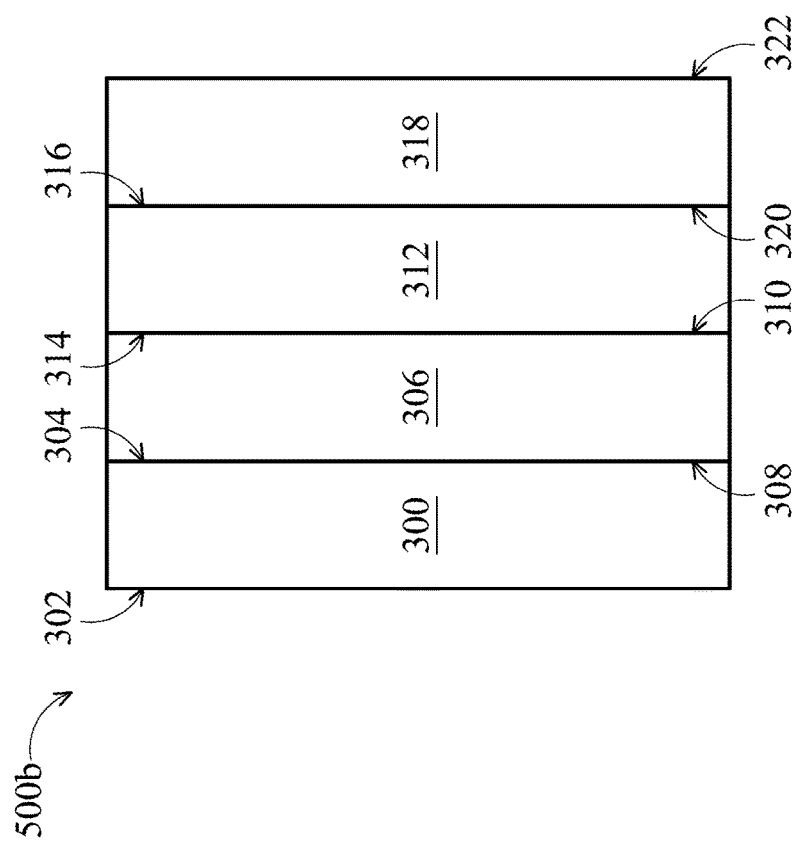
FIG. 2 shows a cross section of a RRAM cell structure according to another embodiment of the disclosure.

FIG. 2 shows a cross section of a RRAM cell structure 500b according to another embodiment of the disclosure. Elements in FIG. 2 that are the same as or similar to those in FIG. 1 are not described again for brevity.

In the embodiment, the RRAM cell structure 500b includes a first electrode 300, an IMT material layer 306, a barrier layer 312 and a second electrode 318. As shown in FIG. 2, the RRAM cell structure 500b has a vertical stack of MIIM structure. Namely, the interface of two adjacent layers in the RRAM cell structure 500b is substantially perpendicular to a surface of a substrate (not shown).

As shown in FIG. 2, the first electrode 300 of the RRAM cell structure 500b has side surfaces 302 and 304 opposite each other. The IMT material layer 306 has side surfaces 308 and 310 opposite each other. The barrier layer 312 has side surfaces 314 and 316 opposite each other. The second electrode 318 has side surfaces 320 and 322 opposite each other. The side surface 304 of the first electrode 300 directly contacts the side surface 308 of the IMT material layer 306. The side surface 310 of the IMT material layer 306 directly contacts the side surface 314 of the barrier layer 312. The side surface 316 of the barrier layer 312 directly contacts the side surface 320 of the second electrode 318.

As shown in FIG. 2, in some embodiments, the material and the fabrication method of the first electrode 300 and the second electrode 318 of the RRAM cell structure 500b may be similar to or the same as that of the first electrode 200 and the second electrode 218 of the RRAM cell structure 500a shown in FIG. 1. The material and the fabrication method of the IMT material layer 306 of the RRAM cell structure 500b may be similar to or the same as that of the IMT material layer 206 of the RRAM cell structure 500a. Moreover, the material and the fabrication method of the barrier layer 312 of the RRAM cell structure 500b may be similar to or the same as that of the barrier layer 212 of the RRAM cell structure 500a.

Figure 3A:
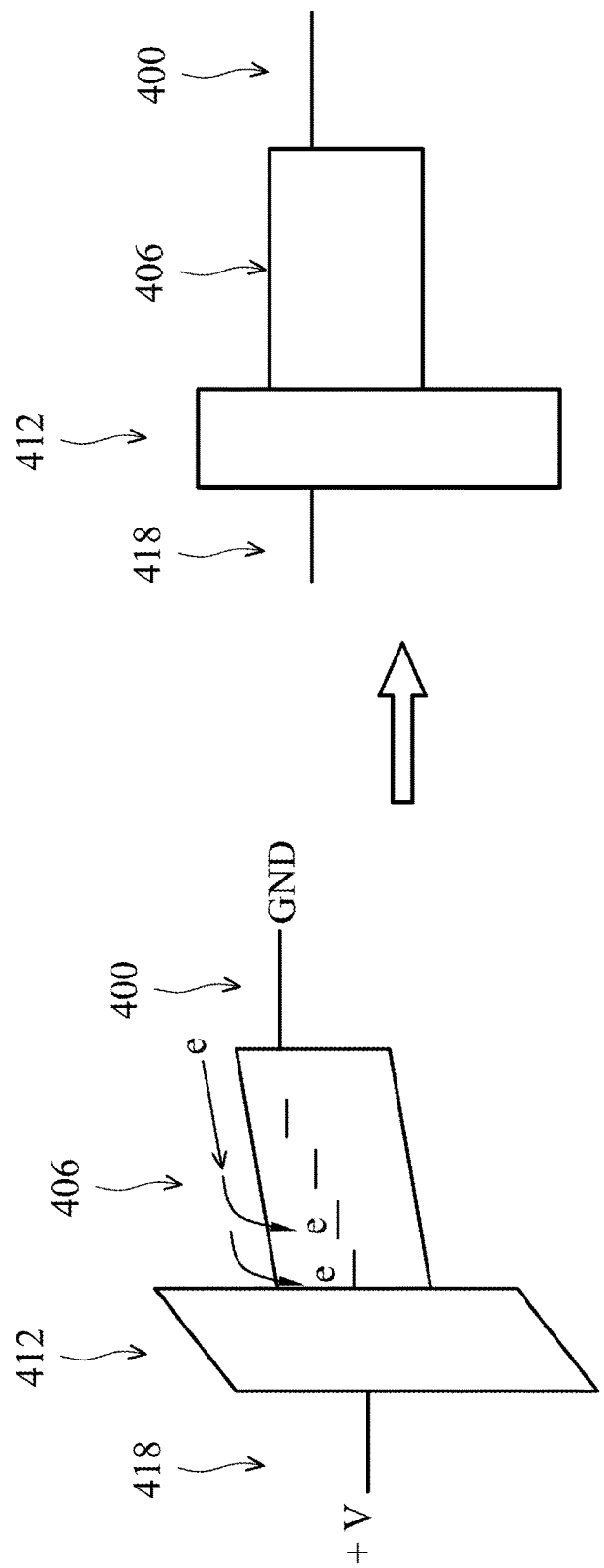
FIGS. 3A and 3B show operation mechanisms for a RRAM cell structure according to some embodiments of the disclosure.
Figure 3B:
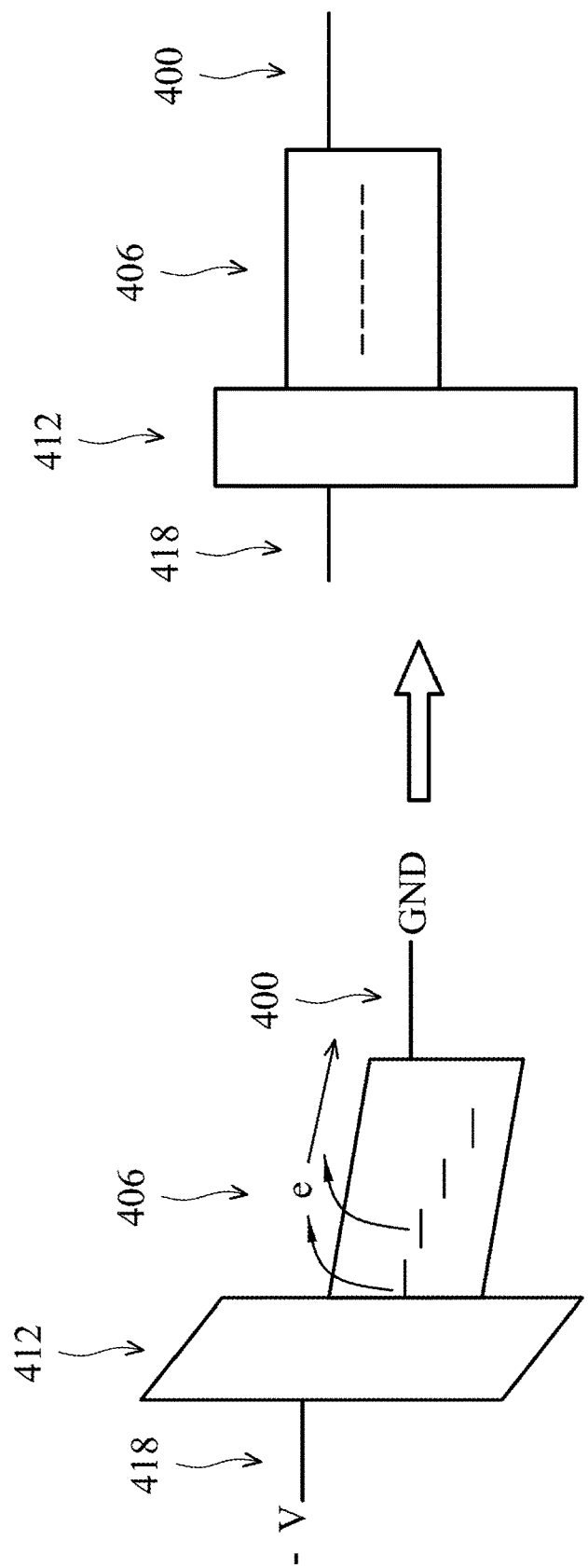

FIGS. 3A and 3B show operation mechanisms for a RRAM cell structure according to some embodiments of the disclosure. FIG. 3A illustrates the operation of the RRAM cell structure in low resistance state (i.e., metallic state) and the bandgap variation. FIG. 3B illustrates the operation of the RRAM cell structure in high resistance state (i.e., insulating state) and the bandgap variation. In FIGS. 3A and 3B, the element 400 is a first electrode of the RRAM cell structure, the element 406 is an IMT material layer of the RRAM cell structure, the element 412 is a barrier layer of the RRAM cell structure, and the element 418 is a second electrode of the RRAM cell structure.

As shown in the bandgap diagram at the left side of the arrow indicated in FIG. 3A, electrons (e) are injected into the IMT material layer 406 from the first electrode 400 (as indicated by the single-line arrow) when the first electrode 400 of the RRAM cell structure is electrically connected to ground (GND) and the second electrode 418 of the RRAM cell structure is electrically coupled to a non-zero positive voltage (+V). Note that the IMT material layer 406 and the second electrode 418 that is coupled to a positive voltage are separated from each other by the barrier layer 412 in the RRAM cell structure. Therefore, when the RRAM cell structure is operated using the method shown in the left side of the arrow indicated in FIG. 3A, the injected electrons from the first electrode 400 are blocked by the barrier layer 412, such that the electrons are not injected into the second electrode 418 and thus the resistance state of the IMT material layer 406 is not switched again. Such a process may be referred to as electron doping. As shown in the bandgap diagram at the right side of the arrow indicated in FIG. 3A, the bandgap of the IMT material layer 406 is transformed to be the same as that of the second electrode 418 after performing electron doping. Namely, the state of the IMT material layer 406 is transformed in a stable low resistance state (i.e., metallic state), and the IMT material layer 406 has a metal characteristic. Moreover, the IMT material layer 406 may form an ohmic contact with the first electrode 400, thereby increasing the electron doping efficiency.

As shown in the bandgap diagram at the left side of the arrow indicated in FIG. 3B0, electrons (e) in the IMT material layer 406 may escape to the first electrode 400 (as indicated by the single-line arrow) when the first electrode 400 of the RRAM cell structure is electrically connected to ground (GND) and the second electrode 418 of the RRAM cell structure is electrically coupled to a non-zero negative voltage (−V). As shown in the bandgap diagram at the right side of the arrow indicated in FIG. 3B, the bandgap returns to a non-electron-doping state after the electrons escape from the IMT material layer 406. Namely, the state of the IMT material layer 406 is transformed in a stable high resistance state (i.e., insulating state), and the IMT material layer 406 has an insulator characteristic. Note that the IMT material layer 406 and the second electrode 418 that is coupled to a negative voltage are separated from each other by the barrier layer 412 in the RRAM cell structure. Therefore, when the RRAM cell structure is operated using the method shown in the left side of the arrow indicated in FIG. 3B, the injected electrons from the second electrode 418 toward the IMT material layer 406 are blocked by the barrier layer 412, such that the electrons are not injected into the IMT material layer 406 and thus the resistance state of the IMT material layer 406 is not switched again.

Figure 4:
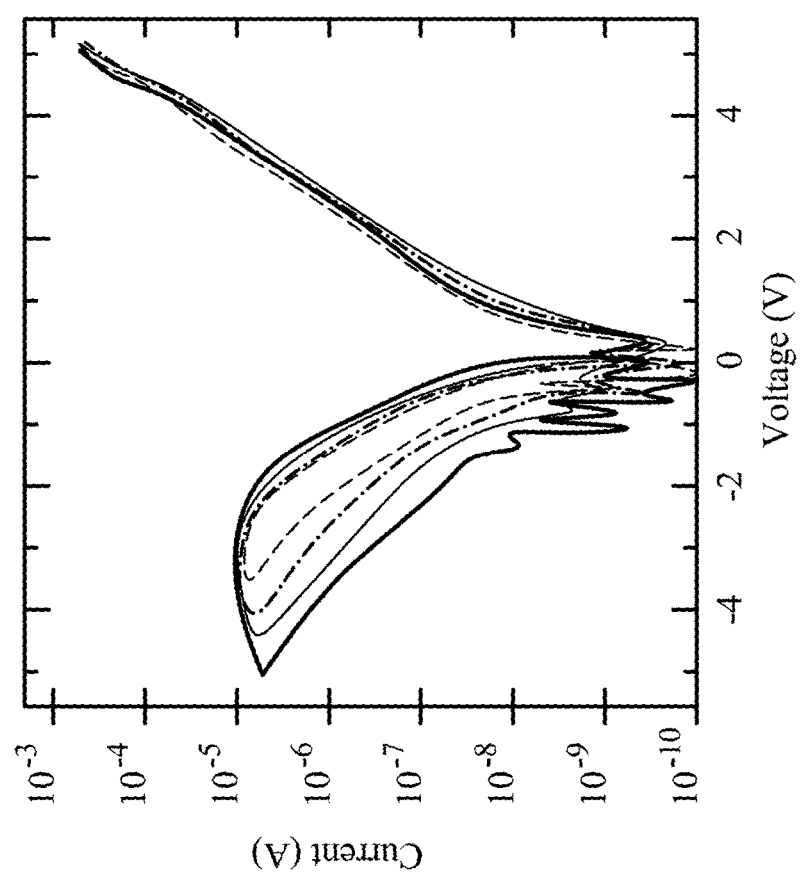
FIG. 4 shows a current-versus-voltage diagram of a RRAM cell structure according to some embodiments of the disclosure.

FIG. 4 shows a current-versus-voltage diagram of a RRAM cell structure according to some embodiments of the disclosure. In the embodiment of FIG. 4, the RRAM cell structure is formed by successively stacking a first electrode (Ti), an IMT material layer ($TiO_2$), a barrier layer ($SiO_2$), and a second electrode (Ta), in which the IMT material layer ($TiO_2$) has a thickness of about 30 nm and the barrier layer ($SiO_2$) has a thickness of about 10 nm.

As shown in FIG. 4, in the embodiment, the RRAM cell structure is a bipolar RRAM that can be placed in a set state by applying a positive voltage. Moreover, the RRAM cell structure has self-compliance and self-rectifying characteristics. As shown in FIG. 4, in the embodiment, the RRAM cell structure can be placed in a set state by applying a minimum voltage of about +5V, and can be placed in a reset state by applying a minimum voltage of about −4V. Moreover, a voltage of about +/−2V can be used for reading the RRAM cell structure. As shown in FIG. 4, in the embodiment, the selected bandgap of the barrier layer of the RRAM cell structure is higher than that of the IMT material layer. Therefore, the current that flows toward the second electrode may be reformed by the barrier layer during the current passing therethrough, while the current that flows toward the first electrode may easily pass through the IMT material layer. When the positive bias voltage applied to the RRAM cell structure is increased (e.g., from 0V to +4V), the current in the RRAM cell structure is reformed, so as to have a self-rectifying characteristic, thereby effectively suppressing the sneak current. Also, as shown in FIG. 4, when the negative bias voltage applied to the RRAM cell structure is increased (e.g., from 0V to −4V), the RRAM cell structure exhibits two resistance states. Moreover, when the negative voltage is increased to −4V, the RRAM cell structure has a current compliance limit level of about less than $10^{-5}$, so as to have a self-compliance characteristic. Additionally, when the applied bias voltage is about ±2V, the current rectification ratio (i.e., the ratio of the current compliance limit level to the rectification current level) of the RRAM cell structure is about more than 10. Moreover, the curves with various types, as shown in FIG. 4, represent the RRAM cell structure that is repeatedly operated many times still has resistive-switching characteristics.

The above mentioned RRAM cell structure may be merely a 1R memory cell structure that has non-linear current-versus-voltage (I-V) relationship properties similar to that of a conventional resistor connected to a unidirectional selector (such as the 1T1R, 1D1R, 1S1R and 1BJT1R RRAM cell structures). In addition, the RRAM cell structure mentioned above is not required for an initial forming step. Namely, the RRAM cell structure may be activated without applying an initial forming voltage. According to the RRAM cell structure mentioned above, the problem of the initial forming voltage damaging the RRAM cell structure due to its high magnitude can be prevented. Accordingly, the RRAM cell structure has better reliability. Moreover, the above mentioned RRAM cell structure has self-compliance and self-rectifying characteristics, and also can overcome the problem of sneak current occurring in the 1R memory cell structures of the conventional RRAM 3D crossbar array architectures.

While the disclosure has been described by way of example and in terms of the preferred embodiments, it is to be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A self-rectifying resistive random access memory (RRAM) cell structure, comprising:
    a first electrode;

an insulator-metal-transition (IMT) material layer disposed on the first electrode, wherein the first electrode is formed of a first metal element of one of Ti and Ta and the IMT material layer is formed of an oxide of the first metal element;

a barrier layer disposed on the IMT material layer; and a second electrode disposed on the barrier layer, wherein the IMT material layer is separated from the second electrode by the barrier layer and the barrier layer directly contacts the second electrode and wherein the second electrode is formed of a second metal element selected from a group consisting of Ni, Zr, Nb, Y, Co, or Ge and the barrier layer is formed of an oxide of the second metal element.

2. The self-rectifying RRAM cell structure as claimed in claim 1, wherein the IMT material layer is a single layer.

3. The self-rectifying RRAM cell structure as claimed in claim 1, wherein the IMT material layer has a first surface and a second surface opposite each other that are in direct contact with the first electrode and the barrier layer, respectively.

4. The self-rectifying RRAM cell structure as claimed in claim 1, wherein the IMT material layer and the first electrode form an ohmic contact.

5. The self-rectifying RRAM cell structure as claimed in claim 1, wherein the barrier layer is separated from the first electrode by the IMT material layer.

6. The self-rectifying RRAM cell structure as claimed in claim 1, wherein the barrier layer has a bandgap higher than 2 eV.

7. The self-rectifying RRAM cell structure as claimed in claim 1, wherein the first electrode is electrically connected to ground, and the second electrode is electrically coupled to a positive or negative voltage.

8. The self-rectifying RRAM cell structure as claimed in claim 1, wherein the self-rectifying RRAM cell structure is a bipolar RRAM cell structure.

9. The self-rectifying RRAM cell structure as claimed in claim 1, wherein the barrier layer is directly disposed on the IMT material layer.

* * * * *